United States Patent
Terada et al.

(10) Patent No.: US 7,646,578 B2
(45) Date of Patent: Jan. 12, 2010

(54) FILTER CIRCUIT AND FILTER DEVICE

(75) Inventors: Yuji Terada, Tokyo (JP); Dai Matsuoka, Tokyo (JP); Koichi Ishii, Tokyo (JP)

(73) Assignee: TDK Corporation, Tokyo (JP)

( * ) Notice: Subject to any disclaimer, the term of this patent is extended or adjusted under 35 U.S.C. 154(b) by 104 days.

(21) Appl. No.: 11/785,211

(22) Filed: Apr. 16, 2007

(65) Prior Publication Data
US 2007/0268647 A1 Nov. 22, 2007

(30) Foreign Application Priority Data
May 19, 2006 (JP) .............................. 2006-140480

(51) Int. Cl.
*H02H 1/00* (2006.01)
*H02H 3/22* (2006.01)
(52) U.S. Cl. ..................................... 361/127
(58) Field of Classification Search .................. 361/127
See application file for complete search history.

(56) References Cited

U.S. PATENT DOCUMENTS 4,999,595 A * 3/1991 Azumi et al. ............... 333/184

| | | | | |
|---|---|---|---|---|
| 6,730,183 B2 * | 5/2004 | Tokuda et al. | ............. | 156/89.12 |
| 7,085,118 B2 * | 8/2006 | Inoue et al. | ................. | 361/119 |
| 7,277,003 B2 * | 10/2007 | Inoue et al. | .................... | 338/20 |
| 2005/0259376 A1 * | 11/2005 | Bishop | ........................ | 361/120 |
| 2007/0070569 A1 * | 3/2007 | Chida et al. | .................. | 361/118 |

FOREIGN PATENT DOCUMENTS

| JP | A 6-45109 | | 2/1994 |
|---|---|---|---|
| JP | 8250309 | * | 9/1996 |
| KR | 10-0732785 | | 6/2007 |

* cited by examiner

*Primary Examiner*—Ronald W Leja
(74) *Attorney, Agent, or Firm*—Oliff & Berridge, PLC (57) ABSTRACT

A filter circuit has first and second varistors, a resistance, an input terminal, an output terminal, and a ground terminal. The resistance is connected between the first and second varistors. The input terminal is connected to a junction between the first varistor and resistance through a first coil. The output terminal is connected to a junction between the second varistor and resistance through a second coil. The ground terminal is connected to a side of the first varistor opposite from the resistance and a side of the second varistor opposite from the resistance.

3 Claims, 8 Drawing Sheets

(PRIOR ART)

Fig.8

FILTER CIRCUIT AND FILTER DEVICE

BACKGROUND OF THE INVENTION

1. Field of the Invention

The present invention relates to a filter circuit and filter device having a varistor and a resistance.

2. Related Background Art

As a conventional filter circuit and filter device, a multilayer chip varistor disclosed in Japanese Patent Application Laid-Open No. HEI 6-45109 has been known, for example. The multilayer chip varistor disclosed in Japanese Patent Application Laid-Open No. HEI 6-45109 comprises a ceramic sintered body; first and second inner electrodes buried in the ceramic sintered body; an input electrode provided on one end face of the ceramic sintered body and connected to one first inner electrode; an output electrode provided on the other end face of the ceramic sintered body and connected to another first inner electrode; a resistor provided on the upper face of the ceramic sintered body and connected between the input and output electrodes; and ground electrodes provided on side faces of the ceramic sintered body and connected to the second inner electrodes. In such a multilayer chip varistor, the first and second inner electrodes and the ceramic layer part held between the first and second inner electrodes form a varistor part.

SUMMARY OF THE INVENTION

The filter device of the above-mentioned prior art attenuates high-frequency noises by the capacitance component of the varistor part. However, the parasitic inductance component existing in series with the varistor part worsens the attenuation characteristic of high frequencies.

It is an object of the present invention to provide a filter circuit and filter device which can improve the attenuation characteristic of high frequencies.

The filter circuit of the present invention comprises first and second varistors; first and second coils; a resistance connected between the first and second varistors; an input terminal connected to a junction between the first varistor and resistor through the first coil; an output terminal connected to a junction between the second varistor and resistance through the second coil; and a ground terminal connected to a side of the first varistor opposite from the resistance and a side of the second varistor opposite from the resistance.

Thus, in the filter circuit of the present invention, the first coil is connected between the input terminal and first varistor, while the second coil is connected between the output terminal and second varistor. Namely, the coils are connected in series with input and output lines, whereby an attenuation effect is obtained at high frequencies. This compensates for the deterioration in attenuation characteristic caused by the parasitic inductance component existing in series with the first and second varistors, thereby improving the attenuation characteristic of high frequencies.

The filter device of the present invention comprises a varistor layer exhibiting a nonlinear current-voltage characteristic; first and second inner electrodes; a third inner electrode having a region opposing the first and second inner electrodes while interposing the varistor layer therebetween; first and second inner conductors forming a coil; a resistor connected between the first and second inner electrodes; an input terminal electrode connected to the first inner electrode through the first inner conductor; an output terminal electrode connected to the second inner electrode through the second inner conductor; and a ground terminal electrode connected to the third inner electrode.

Thus, in the filter device of the present invention, the first inner conductor is connected between the input terminal electrode and first inner electrode, while the second inner conductor is connected between the output terminal electrode and second inner electrode. Here, the first inner electrode, third inner electrode, and varistor layer correspond to the first varistor in the above-mentioned filter circuit, while the second inner electrode, third inner electrode, and varistor layer correspond to the second varistor in the above-mentioned filter circuit. The first inner conductor corresponds to the first coil in the above-mentioned filter circuit, while the second inner conductor corresponds to the second coil in the above-mentioned filter circuit. Therefore, this filter device constitutes the above-mentioned filter circuit. As mentioned above, this compensates for the deterioration in attenuation characteristic caused by the parasitic inductance component existing in series with the first and second varistors, thereby improving the attenuation characteristic of high frequencies.

When a filter circuit formed by two varistors and a resistance is to be constructed by the varistor layer, first to third inner electrodes, and resistor as mentioned above, a connecting conductor for connecting the input and output terminals and the resistor (first and second inner electrodes) is needed to be arranged in the multilayer body. Since the first and second inner conductors forming the coil function as the above-mentioned connecting conductor, the first and second inner conductors forming the coil and the connecting conductor are not required to be disposed separately in the multilayer body in the filter device of the present invention. This can prevent the device from failing to reduce its size.

Preferably, the varistor layer, the first, second, and third inner electrodes, and the first and second inner conductors form a multilayer body; the resistor is provided on a first surface parallel to a laminating direction in the multilayer body; and the input terminal electrode, output terminal electrode, and ground terminal electrode are provided on a second surface opposing the first surface in the multilayer body. In this case, when the input terminal electrode, output terminal electrode, and ground terminal electrode are connected to their corresponding electrodes on a circuit board, the first, second, and third inner electrodes are arranged vertically with respect to the circuit board, whereby the stray capacitance occurring between the inner electrodes and the electrodes of the circuit board can be reduced.

Preferably, the first and second inner conductors are arranged on the same layer as with any of the first, second, and third inner electrodes in the multilayer body. In this case, the filter device can be made easily by forming the first and second inner conductors simultaneously with any of the first, second, and third inner electrodes.

The present invention can improve the attenuation characteristic of high frequencies in the filter circuit and filter device.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the following, preferred embodiments of the filter circuit and filter device in accordance with the present invention will be explained in detail with reference to the drawings.

Figure 1:
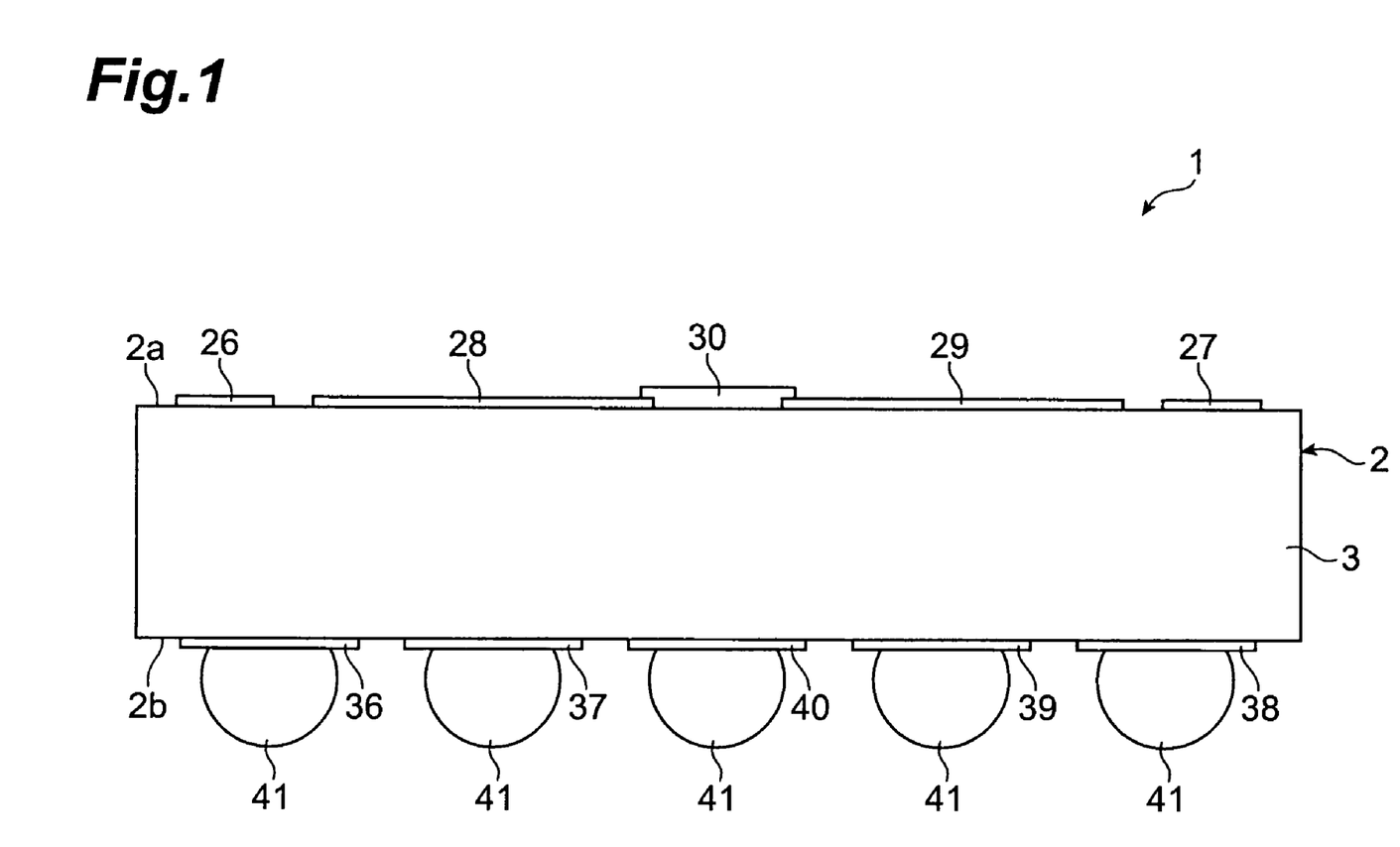
FIG. 1 is a schematic side view showing the filter device in accordance with an embodiment.
Figure 2:
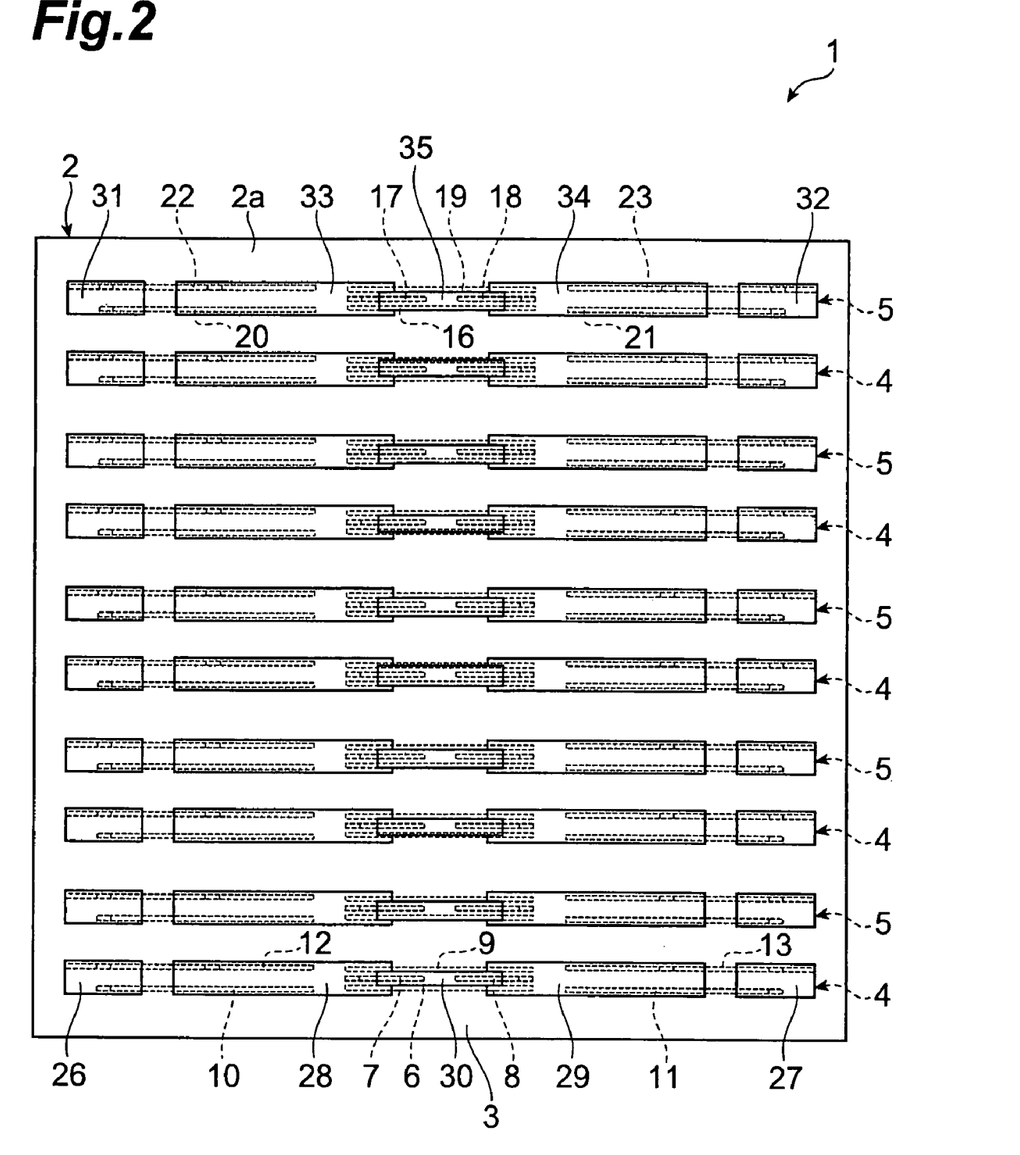
FIG. 2 is a schematic plan view of the filter device shown in FIG. 1.
Figure 3:
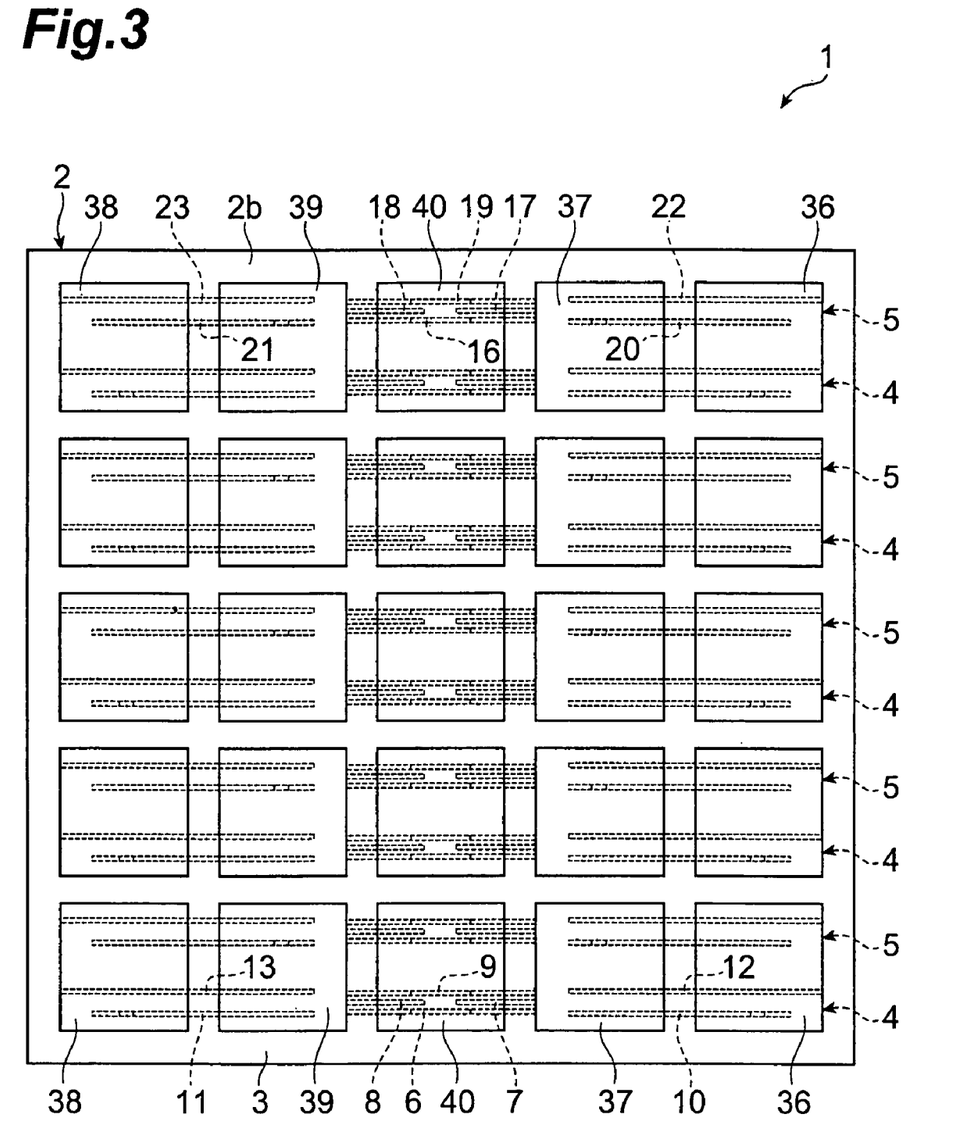
FIG. 3 is a schematic rear view of the filter device shown in FIG. 1.

FIG. 1 is a schematic side view showing one embodiment of the filter device in accordance with the present invention. FIG. 2 is a schematic plan view of the filter device shown in FIG. 1. FIG. 3 is a schematic rear view of the filter device shown in FIG. 1. In each of these drawings, the filter device 1 in accordance with this embodiment is constructed as an anti-ESD (electrostatic charge) device of BGA (Ball Grid Array) type.

The filter device 1 includes a multilayer body 2 shaped like a substantially rectangular plate. The multilayer body 2 has a plurality of varistor layers 3 exhibiting a nonlinear current-voltage characteristic (varistor characteristic), a plurality of (5 here) inner electrode groups 4, and a plurality of (5 here) inner electrode groups 5. The inner electrode groups 4 and 5 are alternately arranged with the varistor layers 3.

The varistor layers 3 are mainly composed of ZnO, for example, and further contain elementary substances or oxides of metals such as rare-earth metal elements, Co, group IIIb elements (B, Al, Ga, In), Si, Cr, Mo, alkaline metal elements (K, Rb, Cs), alkaline-earth metal elements (Mg, Ca, Sr, and Ba), and the like as accessory components.

Figure 4:
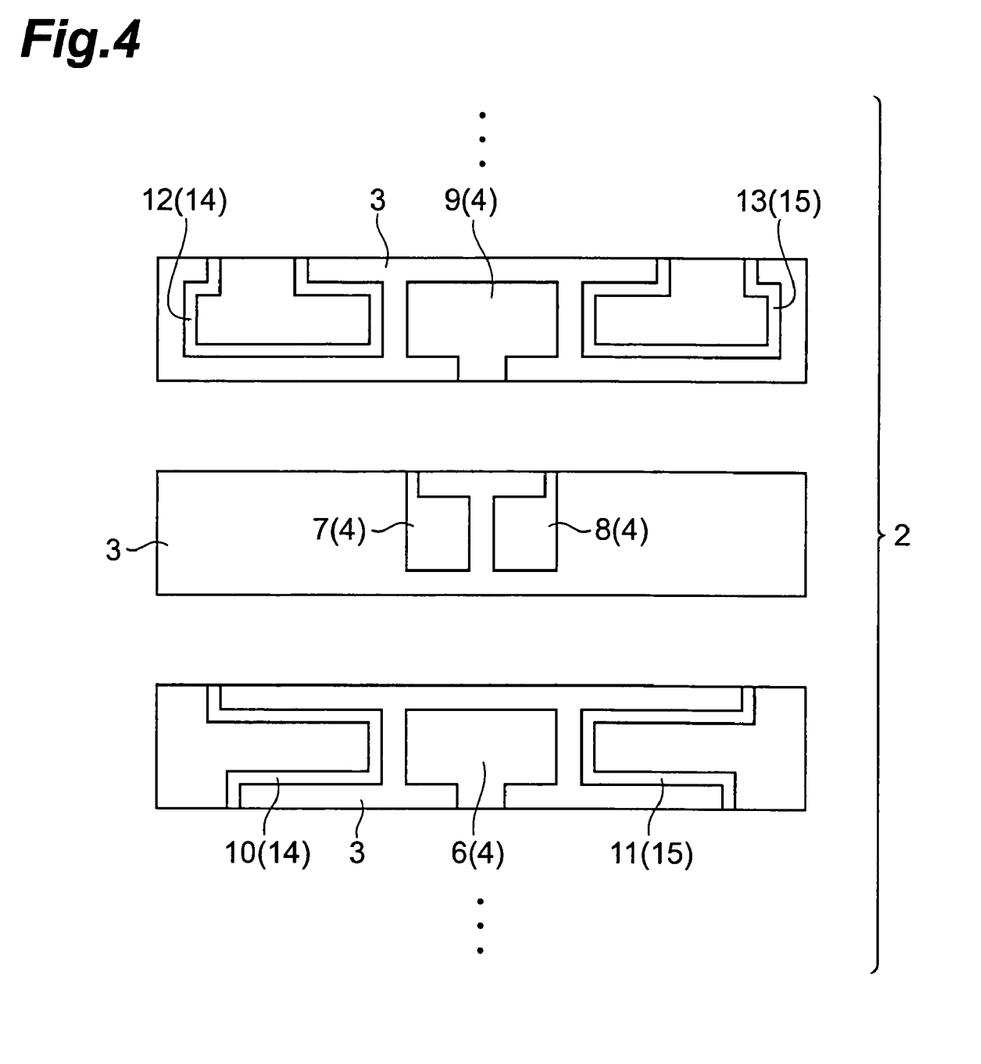
FIG. 4 is an exploded view of the multilayer body shown in FIG. 1.

As shown in FIG. 4, each of the inner electrode groups 4 has an inner electrode 6, inner electrodes 7, 8, and an inner electrode 9. The inner electrode 6, inner electrodes 7, 8, and inner electrode 9 are laminated along a direction (horizontal direction) perpendicular to the vertical direction of the multilayer body 2 while interposing the varistor layer 3. Namely, these inner electrodes 6 to 9 constitute a longitudinal electrode structure. The inner electrodes 7, 8 are arranged in a row on the same layer in the multilayer body 2. The inner electrodes 7, 8 are led so as to be exposed at the upper face (face parallel to the laminating direction) 2a of the multilayer body 2, while the inner electrodes 6, 9 are led so as to be exposed at the lower face (face opposing the upper face 2a) 2b of the multilayer body 2. The inner electrodes 6 to 9 are formed from a conductive material made of Pb or Ag/Pb alloy, for example.

The inner electrode 7 overlaps regions of the inner electrodes 6, 9 on one end side, while the inner electrode 8 overlaps regions of the inner electrodes 6, 9 on the other end side. Therefore, the regions between the inner electrode 7 and the inner electrodes 6 and 9 and the regions between the inner electrode 8 and the inner electrodes 6 and 9 in the varistor layer 3 function as regions exhibiting a varistor characteristic. The inner electrodes 6, 7, 8 and regions placed between the inner electrode 7 and the inner electrodes 6 and 9 in the varistor layer 3 constitute one varistor portion. The inner electrodes 6, 8, 9 and regions placed between the inner electrode 8 and the inner electrodes 6 and 9 in the varistor layer 3 constitute another varistor portion.

On the same layer as with the inner electrode 6 in the multilayer body 2, inner conductors 10, 11 forming a part of a coil are arranged so as to place the inner electrode 6 therebetween. On the same layer as with the inner electrode 9 in the multilayer body 2, inner conductors 12, 13 forming a part of a coil are arranged so as to place the inner electrode 9 therebetween. The inner conductors 10, 12 form one coil 14, while the inner conductors 11, 13 form one coil 15.

The inner conductors 10, 11 are led so as to be exposed at the upper face 2a of the multilayer body 2 on one end side and the lower face 2b thereof on the other end side. Both end sides of each of the inner conductors 12, 13 are led so as to be exposed at the upper face 2a of the multilayer body 2. The inner conductors 10 to 13 are formed from a conductive material made of Pb or Ag/Pb alloy, for example, as with the above-mentioned inner electrodes 6 to 9.

Figure 5:
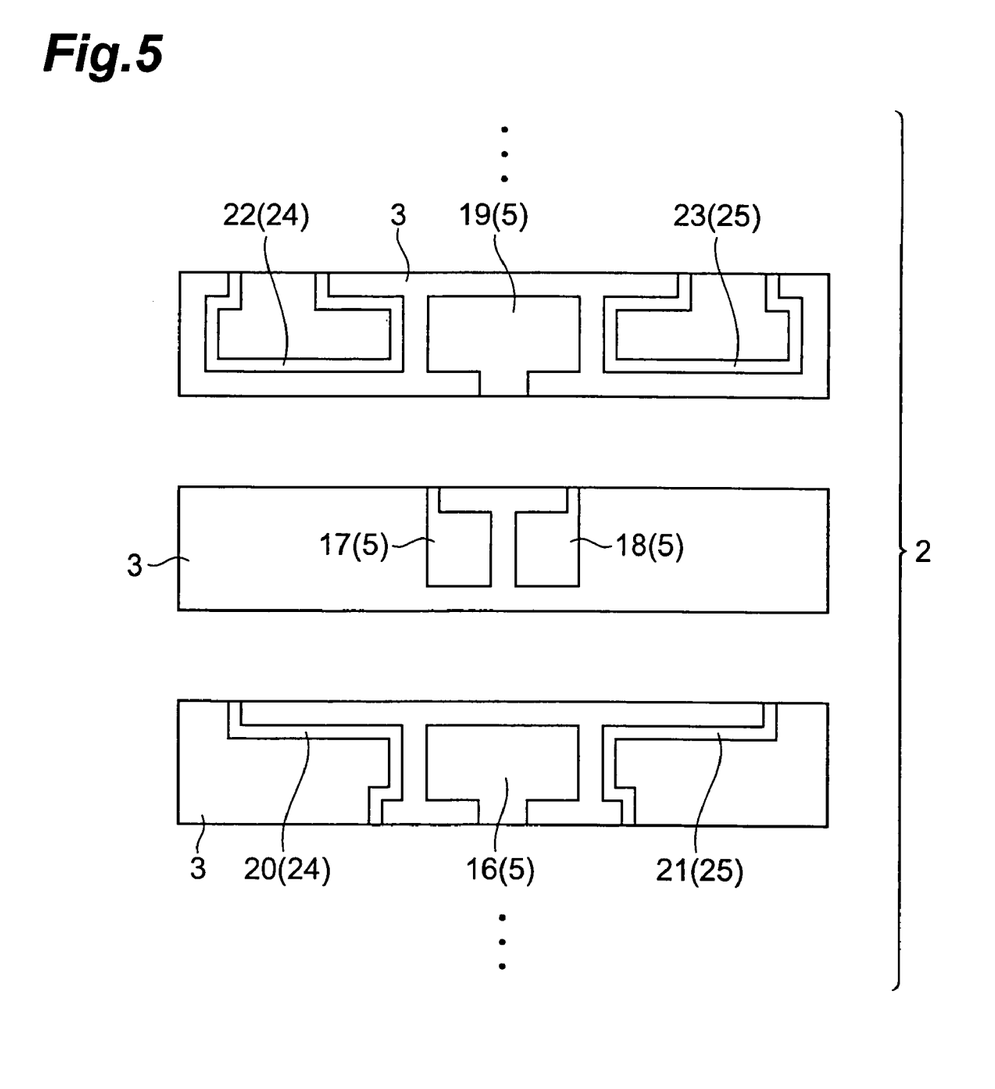
FIG. 5 is an exploded view of the multilayer body shown in FIG. 1.

As shown in FIG. 5, each of the inner electrode groups 5 has an inner electrode 16, inner electrodes 17, 18, and an inner electrode 19. The inner electrode 16, inner electrodes 17, 18, and inner electrode 19 are laminated along the horizontal direction of the multilayer body 2 while interposing the varistor layer 3. Therefore, these inner electrodes 16 to 19 also constitute a longitudinal electrode structure. The inner electrodes 17, 18 are arranged in a row on the same layer in the multilayer body 2. The inner electrodes 17, 18 are led so as to be exposed at the upper face 2a of the multilayer body 2, while the inner electrodes 16, 19 are led so as to be exposed at the lower face 2b of the multilayer body 2. The inner electrodes 16 to 19 are formed from the same conductive material as that of the above-mentioned inner electrodes 6 to 9.

The inner electrode 17 overlaps regions of the inner electrodes 16, 19 on one end side, while the inner electrode 18 overlaps regions of the inner electrodes 16, 19 on the other end side. Therefore, the regions between the inner electrode 17 and the inner electrodes 16 and 19 and the regions between the inner electrode 18 and the inner electrodes 16 and 19 in the varistor layer 3 function as regions exhibiting a varistor characteristic. The inner electrodes 16, 17, 19 and regions placed between the inner electrode 17 and the inner electrodes 16 and 19 in the varistor layer 3 constitute one varistor portion. The inner electrodes 16, 18, 19 and regions placed between the inner electrode 18 and the inner electrodes 16 and 19 in the varistor layer 3 constitute another varistor portion.

On the same layer as with the inner electrode 16 in the multilayer body 2, inner conductors 20, 21 forming a part of a coil are arranged so as to place the inner electrode 16 therebetween. On the same layer as with the inner electrode 19 in the multilayer body 2, inner conductors 22, 23 forming a part of a coil are arranged so as to place the inner electrode 19 therebetween. The inner conductors 20, 22 form one coil 24, while the inner conductors 21, 23 form one coil 25.

The inner conductors 20, 21 are led so as to be exposed at the upper face 2a of the multilayer body 2 on one end side and the lower face 2b thereof on the other end side. Both end sides of each of the inner conductors 22, 23 are led so as to be exposed at the upper face 2a of the multilayer body 2. The inner electrodes 20 to 23 are formed from the same conductive material as that of the above-mentioned inner conductors 10 to 13.

In FIG. 2, connecting electrodes 26 each electrically connecting one end part of the inner conductor 10 and one end part of the inner conductor 12 to each other, connecting electrodes 27 each electrically connecting one end part of the inner conductor 11 and one end part of the inner conductor 13 to each other, connecting electrodes 28 each electrically connecting the inner electrode 7 and the other end part of the inner conductor 12 to each other, and connecting electrodes 29 each electrically connecting the inner electrode 8 and the other end part of the inner conductor 13 to each other are arranged on the upper face 2a of the multilayer body 2. These connecting electrodes 26 to 29 are provided by the number of sets corresponding to the number of inner electrode groups 4. Each of the connecting electrodes 26 to 29 has a two-layer structure composed of a lower electrode layer made of Pb or Ag/Pb alloy and an upper electrode layer made of Au or Pt, for example.

Above the multilayer body 2, resistors 30 are arranged so as to bridge the respective pairs of connecting electrodes 28 and 29. Namely, one end of each resistor 30 is electrically connected to the inner electrode 7, while the other end thereof is connected to the inner electrode 8.

The resistors 30 are formed by coating with a resistance paste based on Ru, Sn, or La. As the Ru-based resistance paste, one in which glass of $Al_2O_3$—$B_2O_3$—$SiO_2$ or the like is mixed with $RuO_2$, for example, is employed. As the Sn-based resistance paste, one in which glass of $Al_2O_3$—$B_2O_3$—$SiO_2$ or the like is mixed with $SnO_2$, for example, is employed. As the La-based resistance paste, one in which glass of $Al_2O_3$—$B_2O_3$—$SiO_2$ or the like is mixed with $LaB_6$, for example, is employed.

Connecting electrodes 31 each electrically connecting one end part of the inner conductor 20 and one end part of the inner conductor 22 to each other, connecting electrodes 32 each electrically connecting one end part of the inner conductor 21 and one end part of the inner conductor 23 to each other, connecting electrodes 33 each electrically connecting the inner electrode 17 and the other end part of the inner conductor 22 to each other, and connecting electrodes 34 each electrically connecting the inner electrode 18 and the other end part of the inner conductor 23 to each other are arranged on the upper face 2a of the multilayer body 2. These connecting electrodes 31 to 34 are provided by the number of sets corresponding to the number of inner electrode groups 5. Each of the connecting electrodes 31 to 34 has a two-layer structure as with the above-mentioned connecting electrodes 26 to 29.

Above the multilayer body 2, resistors 35 are arranged so as to bridge the respective pairs of connecting electrodes 33 and 34. Namely, one end of each resistor 35 is electrically connected to the inner electrode 17, while the other end thereof is connected to the inner electrode 18. The resistors 35 are formed from the same material as that of the above-mentioned resistors 30.

In FIG. 3, input terminal electrodes 36 each electrically connected to the other end part of the inner conductor 10, input terminal electrodes 37 each electrically connected to the other end part of the inner conductor 20, output terminal electrodes 38 each electrically connected to the other end part of the inner conductor 11, output terminal electrodes 39 each electrically connected to the other end part of the inner conductor 21, and ground terminal electrodes 40 electrically connected to the inner electrodes 6, 9 and inner electrodes 16, 19 are arranged on the lower face 2b of the multilayer body 2.

The input terminal electrodes 36, 37, output terminal electrodes 38, 39, and ground terminal electrodes 40, each of which has a rectangular form, for example, are provided by the number of sets (5 sets here) corresponding to that of the inner electrode groups 4, 5. These terminal electrodes 36 to 40 are formed from the same material as that of the above-mentioned connecting electrodes 31 to 34, for example. Solder balls 41 are formed on the respective surfaces of the terminal electrodes 36 to 40 as shown in FIG. 1. When the solder balls 41 are connected to lands of an external substrate (not depicted), the filter device 1 is mounted to the external substrate.

Figure 6:
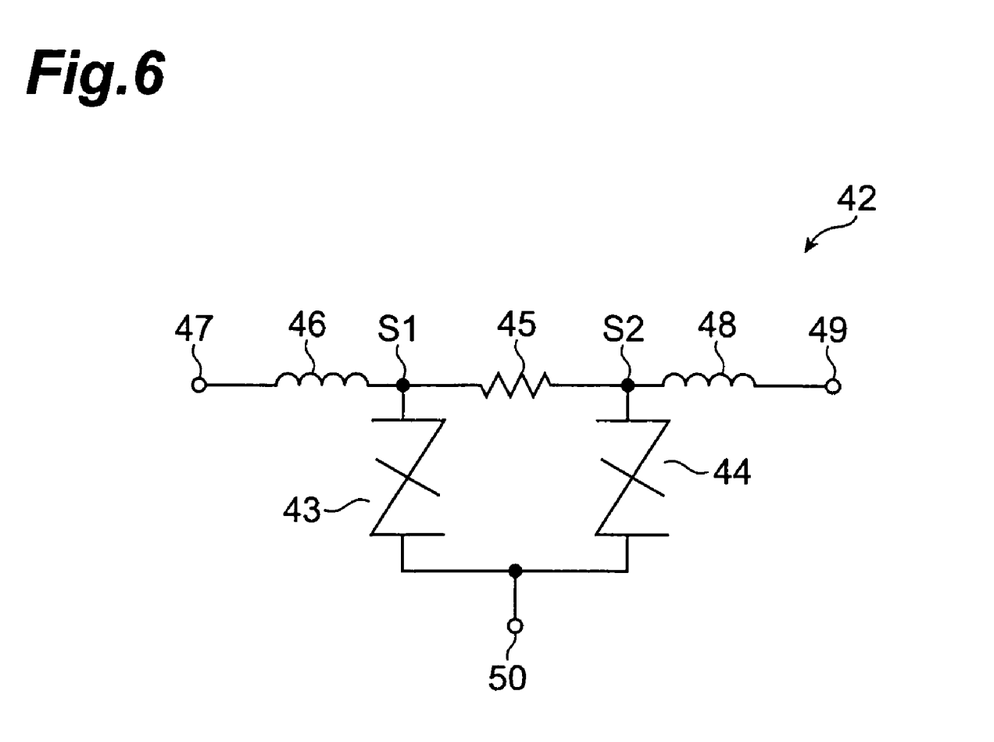
FIG. 6 is a diagram showing an equivalent circuit (filter circuit) of the filter device shown in FIG. 1.

The foregoing filter device 1 has a plurality of filter circuits 42 such as the one shown in FIG. 6. The filter circuit 42 has varistors 43, 44, while a resistance 45 is connected in series between the varistors 43, 44. One end of the coil 46 is connected to the junction S1 between the varistor 43 and resistance 45. The other end of the coil 46 is connected to an input terminal 47. One end of the coil 48 is connected to the junction S2 between the varistor 44 and resistance 45. The other end of the coil 48 is connected to an output terminal 49. A ground terminal 50 is connected to the varistors 43, 44 on the side opposite from the resistance 45.

Here, the varistor 43 corresponds to the varistor portion constructed by the inner electrodes 6, 7, 9 and the regions placed between the inner electrode 7 and inner electrodes 6 and 9 in the varistor layer 3 in the above-mentioned filter device 1. The varistor 43 also corresponds to the varistor portion constructed by the inner electrodes 16, 17, 19 and the regions placed between the inner electrode 17 and inner electrodes 16 and 19 in the varistor layer 3 in the above-mentioned filter device 1. The varistor 44 corresponds to the varistor portion constructed by the inner electrodes 6, 8, 9 and the regions placed between the inner electrode 8 and inner electrodes 6 and 9 in the varistor layer 3 in the above-mentioned filter device 1. The varistor 44 also corresponds to the varistor portion constructed by the inner electrodes 16, 18, 19 and the regions placed between the inner electrode 18 and inner electrodes 16 and 19 in the varistor layer 3 in the above-mentioned filter device 1.

The resistance 45 corresponds to the resistors 30, 35 in the above-mentioned filter device 1. The coil 46 corresponds to the coils 14, 24 in the above-mentioned filter device 1. The coil 48 corresponds to the coils 15, 25 in the above-mentioned filter device 1. The input terminal 47 corresponds to the input terminal electrodes 36, 37 in the above-mentioned filter device 1. The output terminal 49 corresponds to the output terminal electrodes 38, 39 in the above-mentioned filter device 1. The ground terminal 50 corresponds to the ground terminal electrode 40 in the above-mentioned filter device 1.

A method of manufacturing the above-mentioned filter device 1 will now be explained in brief. First, a predetermined number of green sheets to become the above-mentioned varistor layers 3 are made. Specifically, a slurry made by adding an organic binder, an organic solvent, and the like to a varistor material mainly composed of ZnO is applied onto a film by doctor blading or the like and dried, so as to yield green sheets.

Subsequently, patterns rendering the above-mentioned inner electrodes 6 to 9, inner electrodes 16 to 19, and inner conductors 20 to 23 are formed on surfaces of green sheets. These patterns are formed by screen-printing a conductive paste mainly composed of Pd, for example, onto the surfaces of green sheets and then drying it. This forms the inner electrode 6 and inner conductors 10, 11 at the same time, the inner electrode 9 and inner conductors 12, 13 at the same time, the inner electrode 16 and inner conductors 20, 21 at the same time, and the inner electrode 19 and inner conductors 22, 23 at the same time, whereby the process of manufacturing the filter device 1 can be simplified.

Next, the green sheets formed with predetermined patterns and green sheets formed with no patterns are stacked in a predetermined order, so as to form a sheet multilayer body, which is then cut into a predetermined size.

Subsequently, connecting electrodes 26 to 29 and connecting electrodes 31 to 34 are formed on the upper face of the sheet multilayer body, whereas input terminal electrodes 36, 37, output terminal electrodes 38, 39, and ground terminal electrodes 40 are formed on the lower face of the sheet multilayer body. These outer electrodes are formed in the following manner, for example. Namely, a conductive paste mainly composed of Pb is initially screen-printed on a surface of the sheet multilayer body and dried, so as to form a lower electrode layer. Further, a conductive paste mainly composed of Au or Pt is screen-printed on the surface of the lower electrode layer and dried, so as to form an upper electrode layer.

Next, the sheet multilayer body is debindered and then sintered, so as to yield the above-mentioned multilayer body 2. As a consequence, the green sheets become the above-mentioned varistor layers 3. Subsequently, resistors 30, 35 are formed on the upper face 2a of the multilayer body 2. Specifically, the resistance paste is initially screen-printed on a surface of the multilayer body 2, and then dried and baked, so as to form resistors 30, 35.

Thereafter, solder balls 41 are formed on the input terminal electrodes 36, 37, output terminal electrodes 38, 39, and ground terminal electrodes 40. The foregoing completes the above-mentioned filter device 1.

Figure 7:
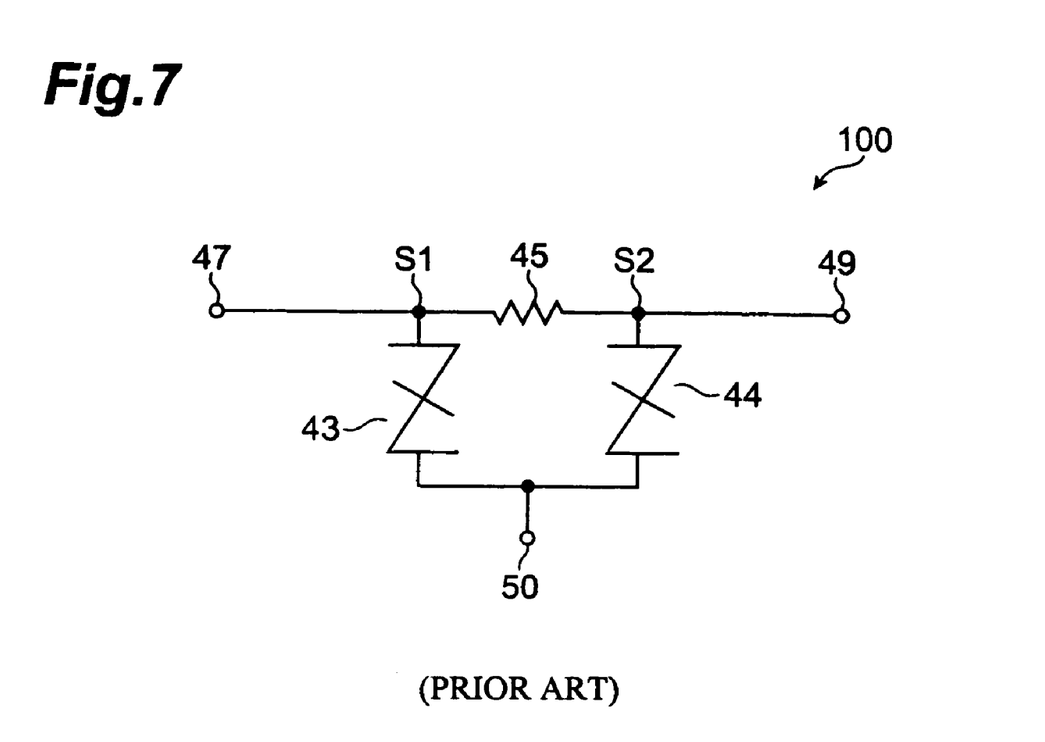
FIG. 7 is a diagram showing a conventionally typical filter circuit having varistors and a resistance.

FIG. 7 shows a conventionally typical filter circuit having varistors and a resistance as a comparative example. The filter circuit 100 in this drawing has a circuit structure excluding the coils 46, 48 from the above-mentioned filter circuit 42. Namely, the input terminal 47 is directly connected to the junction S1 between the varistor 43 and resistance 45, while the output terminal 49 is directly connected to the junction S2 between the varistor 44 and resistance 45. In such a filter circuit 100, a parasitic inductance component exists in series with the varistors 43, 44, thereby deteriorating the attenuation characteristic of high frequencies.

In the filter circuit 42 of this embodiment, by contrast, the coil 46 is connected between the junction S1 and input terminal 47, while the coil 48 is connected between the junction S2 and output terminal 49 as shown in FIG. 6. Namely, the coils 46, 48 are connected in series with the input and output lines, whereby the attenuation characteristic is obtained at high frequencies. This compensates for the deterioration in the attenuation characteristic of high frequencies caused by the parasitic inductance component existing in series with the varistors 43, 44, whereby the frequency characteristic of the filter circuit 42 can be improved.

As the dielectric constant of the coils 46, 48 lowers here, the self-resonant frequency of the coils 46, 48 rises, whereby the attenuation characteristic of high frequencies becomes better. For this purpose, it will be preferred if a material having a lower dielectric constant is used for the varistor layers 3 in the filter device 1. In the filter device 1, the inner conductors 10, 12 forming the coil 14 are constituted by a conductive material mainly composed of Pb having a high resistance and thus can alleviate the influence of the self-resonance of the coil 14. The same holds for the other coils 15, 24, 25. As a consequence, the attenuation characteristic of high frequencies can be made further better.

The inner conductors 10, 12 forming the coil 14 also function as connecting conductors connecting the resistor 30 (inner electrode 7) and input terminal electrode 36 to each other within the multilayer body 2. Namely, the inner conductors 10, 12 forming the coil 14 are made as replacements for a connecting conductor connecting the resistor 30 (inner electrode 7) and input terminal electrode 36 to each other within the multilayer body 2, whereby the coil 14 is formed with a favorable space efficiency. The same holds for the other coils 15, 24, 25. In addition, the inner conductors 10, 11 are arranged on the same layer as with the inner electrode 6, the inner conductors 12, 13 are arranged on the same layer as with the inner electrode 9, the inner conductors 20, 21 are arranged on the same layer as with the inner electrode 16, and the inner conductors 22, 23 are arranged on the same layer as with the inner electrode 19. This can make the filter device 1 smaller.

Further, the inner electrodes 6 to 9 and inner electrodes 16 to 19 have longitudinal electrode structures and thus can easily be led to the main faces (upper face 2a and lower face 2b) of the multilayer body 2, whereby outer electrodes such as the input terminal electrodes 36, 37, output terminal electrodes 38, 39, ground terminal electrodes 40, and connecting electrodes 26 to 29 can easily be arranged and formed on the multilayer body 2. When the filter device 1 is mounted to an external substrate (not depicted), the inner electrodes 6 to 9 and inner electrodes 16 to 19 are erect with respect to the external board, whereby stray capacitance is harder to occur between these inner electrodes and their corresponding electrode pads of the external board.

Figure 8:
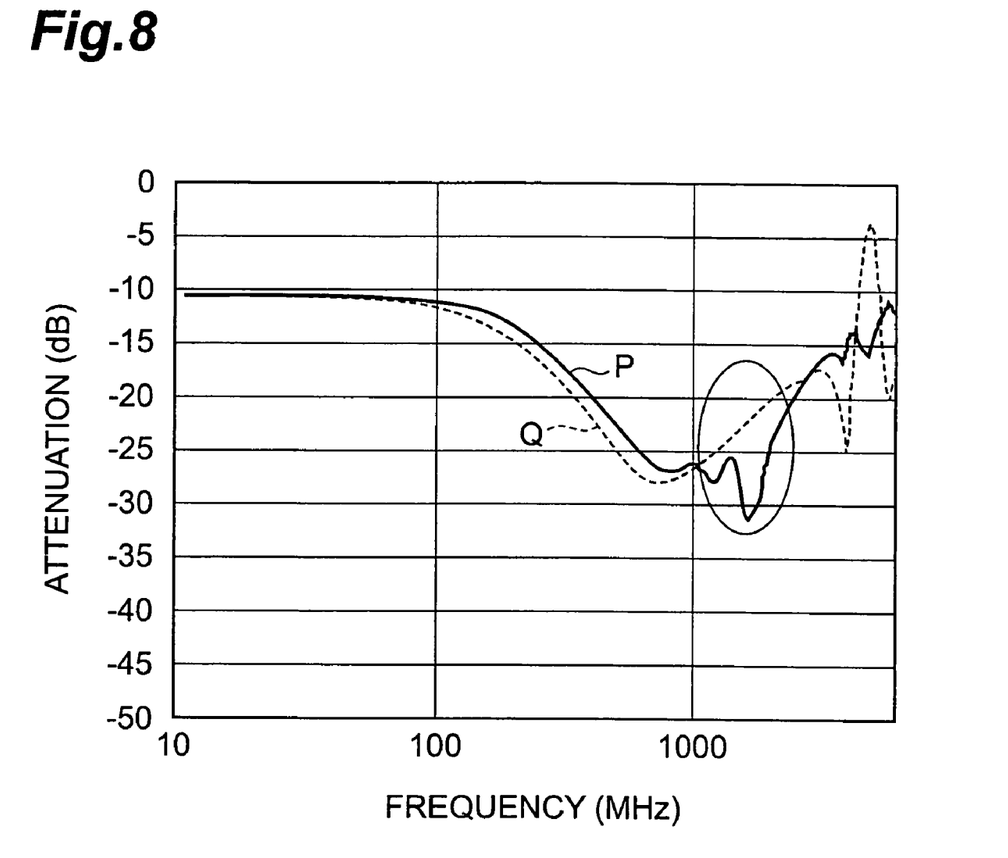
FIG. 8 is a graph showing results of evaluation of the attenuation characteristic in filter devices.

FIG. 8 is a graph showing results of evaluation of the attenuation characteristic in filter devices. The solid line P in the graph shows the results of evaluation of the attenuation characteristic in the filter device in accordance with this embodiment, whereas the broken line Q in the graph shows the results of evaluation of the attenuation characteristic in the filter device in accordance with the above-mentioned comparative example. In the filter device in accordance with the comparative example, connecting conductors connecting the input and output terminal electrodes and the resistor are formed in place of the inner conductors forming the coils.

As can be seen from the graph of FIG. 8, though some fluctuations exist, the filter device in accordance with this embodiment attenuates in a frequency band higher than that in the filter device in accordance with the comparative example as well, thereby improving the attenuation characteristic. This clearly verifies the effect of the present invention.

The present invention is not limited to the above-mentioned embodiment. For example, the inner conductors forming the coils may be arranged on layers formed with no inner electrodes in the multilayer body 2. Here, the number of turns of a coil can be set appropriately by changing the number of layers of inner conductors forming the coil.

The inner conductors forming a coil may be connected to each other by a through-hole conductor instead of a connecting electrode. This makes the connecting electrode unnecessary, thereby increasing the degree of freedom in designing the arrangement of other electrodes on the device. Therefore, the electrodes are easier to print, whereby the filter device can be made easily.

Though the filter device 1 of the above-mentioned embodiment is an array-like filter device having a plurality of filter circuits 42 each shown in FIG. 6, the filter device of the present invention is not limited to the array form in particular, but also applicable to those having only one filter circuit.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A filter circuit comprising:
   first and second varistors;
   first and second coils;
   a resistance connected between the first and second varistors;
   an input terminal connected to a junction between the first varistor and the resistance through the first coil;
   an output terminal connected to a junction between the second varistor and the resistance through the second coil; and
   a ground terminal connected to a side of the first varistor opposite from the resistance and a side of the second varistor opposite from the resistance.

2. A filter device comprising:
   a varistor layer exhibiting a nonlinear current-voltage characteristic;
   first and second inner electrodes;
   a third inner electrode having a region opposing the first and second inner electrodes while interposing the varistor layer therebetween;
   first and second inner conductors forming a coil;
   a resistor connected between the first and second inner electrodes;
   an input terminal electrode connected to the first inner electrode through the first inner conductor:
   an output terminal electrode connected to the second inner electrode through the second inner conductor; and
   a ground terminal electrode connected to the third inner electrode, wherein the first and second inner conductors are arranged on the same layer as with any of the first, second, and third inner electrodes in the multilayer body.

3. A filter device according to claim 2, wherein the varistor layer, the first, second, and third inner electrodes, and the first and second inner conductors form a multilayer body;
   wherein the resistor is provided on a first surface parallel to a laminating direction in the multilayer body; and
   wherein the input terminal electrode, output terminal electrode, and ground terminal electrode are provided on a second surface opposing the first surface in the multilayer body.

* * * * *